(12) United States Patent
Wuyts

(10) Patent No.: US 6,178,627 B1
(45) Date of Patent: Jan. 30, 2001

(54) METHOD FOR POSITIONING A PRINTED-CIRCUIT BOARD IN A PRESS

(75) Inventor: Robert A. Wuyts, Antwerp (BE)

(73) Assignee: Framatome Connectors International, Courbevoie (FR)

( * ) Notice: Under 35 U.S.C. 154(b), the term of this patent shall be extended for 0 days.

(21) Appl. No.: 09/312,423

(22) Filed: May 14, 1999

(30) Foreign Application Priority Data

May 15, 1998 (BE) .................................................. 98/00370

(51) Int. Cl.[7] .................................................. H05K 3/30
(52) U.S. Cl. ........................... 29/837; 29/739; 29/740; 29/741; 29/832; 29/833; 29/834; 29/837
(58) Field of Search ................... 29/833, 834, 832, 29/739, 740, 741, 737

(56) References Cited

U.S. PATENT DOCUMENTS

| | | | |
|---|---|---|---|
| 5,142,777 | * 9/1992 | Boyer | 29/884 |
| 5,208,968 | * 5/1993 | Camsell | 29/739 |
| 5,235,740 | * 8/1993 | Kroeker | 29/741 |
| 5,276,962 | * 1/1994 | Harting | 29/837 |
| 5,400,502 | * 3/1995 | Ota | 29/845 |
| 5,410,801 | 5/1995 | Shiloh et al. | 29/740 |
| 5,499,443 | * 3/1996 | Ota | 29/741 |
| 5,509,192 | 4/1996 | Olta et al. | 29/741 |
| 5,815,917 | * 10/1998 | Clark | 29/842 |
| 5,850,691 | * 12/1998 | Bell | 29/845 |
| 5,890,281 | * 4/1999 | Thaller | 29/830 |
| 5,924,192 | * 7/1999 | Wuyts | 29/833 |
| 6,052,895 | * 4/2000 | Bianca | 29/881 |

FOREIGN PATENT DOCUMENTS 0 772 381 A1    5/1997 (EP) .

* cited by examiner

Primary Examiner—Stephen F. Gerrity
Assistant Examiner—Paul D. Kim
(74) Attorney, Agent, or Firm—Perman & Green, LLP

(57) ABSTRACT

The method consists in aligning a printed-circuit board 2 with respect to an insertion die 4 containing grooves 8, and an anvil 3 containing grooves 6 of a manually operated press, in order for at least one electronic component 1, which is provided with projecting contact pins 7 with elastic attachment zones, to be inserted into a selected insertion zone in the PCB 2, the insertion die 4 and the anvil 3 always being aligned with respect to one another along an insertion center line c, and the printed-circuit board being attached to a manually displaceable X-Y table, the position of the center point p of the selected insertion zone being respectively defined by means of a Y-coordinate and an X-coordinate with respect to the insertion center line c, the table being moveable within a first tracking zone, the area of which extends over a great distance with respect to the insertion center line c, and within a second tracking zone, the area of which extends over a limited distance with respect to the insertion center line c.

11 Claims, 5 Drawing Sheets

METHOD FOR POSITIONING A PRINTED-CIRCUIT BOARD IN A PRESS

BACKGROUND OF THE INVENTION

The invention relates to a method and device for positioning or aligning a printed-circuit board in relation to the die and the anvil of a press, and more specifically a manually operated press for inserting connectors which are provided with so-called press-fit contact pins into a printed-circuit board, referred to below as PCB.

For connectors which are provided with press-fit contact pins of this nature to be manually arranged in a PCB, an operation which involves pushing a series of pins simultaneously into a selected corresponding series of holes in the PCB, use is made of a press, which generally comprises a frame which is able to withstand the force between a fixed part and a moving part.

The fixed part is generally provided with an anvil, and the moving part, or ram, is provided with an insertion die and this insertion die is always perfectly aligned with the anvil, in other words their centre points always lie on the same vertical insertion centre line.

The problem is to adjust the centre point or reference position of the selected insertion zone of the PCB as accurately and quickly as possible with respect to this vertical insertion centre line between die and anvil of the press.

Since the press-fit pins of the connectors have to be pushed transversely through the PCB, the anvil is provided with openings, in the form of regularly distributed grooves, which are arranged on the top of the anvil. The distance between these grooves corresponds to the standard distance between the contact pins.

The insertion die may either be planar, if the connector can be inserted using a planar die, or may likewise be provided with grooves or pins, if the connector cannot be inserted using a planar die.

The problem with a manually operated press of this nature consists primarily in correctly positioning the PCB with respect to the anvil and the insertion die, and more particularly in positioning the holes in the selected insertion zone of this PCB with respect to the grooves in the anvil and, if appropriate, the grooves in the insertion die.

This positioning is generally carried out by means of a X-Y table to which the PCB is attached.

The connector is usually placed manually into the corresponding holes in the PCB, after which, by means of the insertion die of the press, the elastic attachment zones of the contact pins of the connector are pressed into the holes in the PCB.

If the holes in the PCB do not precisely coincide with the openings or grooves in the anvil, the contact pins of the connector will be pressed together or crushed.

This is unacceptable, since is causes irreparable damage to both the contact pins and the connector.

The same problem may arise in the event of incorrect alignment or positioning of the upwardly projecting contact pins of a connector with respect to the insertion die of the press.

In the absence of a correct alignment means, it is usual to employ the insertion die as an intermediate adjustment piece, the die being positioned manually in the connector before the connector is actually inserted into the PCB.

Then, the ram or a planar die can be used to exert pressure on the top side of the insertion die before the connector is inserted into the PCB.

It is clear that such a procedure, in which the operator, before each insertion operation, has to arrange the intermediate piece or insertion die on the connector and remove it, wastes considerable time.

The object of the present invention is to resolve the problems indicated above in a simple and efficient manner, while also eliminating much time-consuming work.

To this end, the method and the device have the characteristic features explained in the appended claims.

BRIEF DESCRIPTION OF THE DRAWINGS

The invention is explained in more detail with reference to the following description and drawings, which illustrate an embodiment of a device according to the invention.

DETAILED DESCRIPTION OF THE INVENTION

Figure 1:
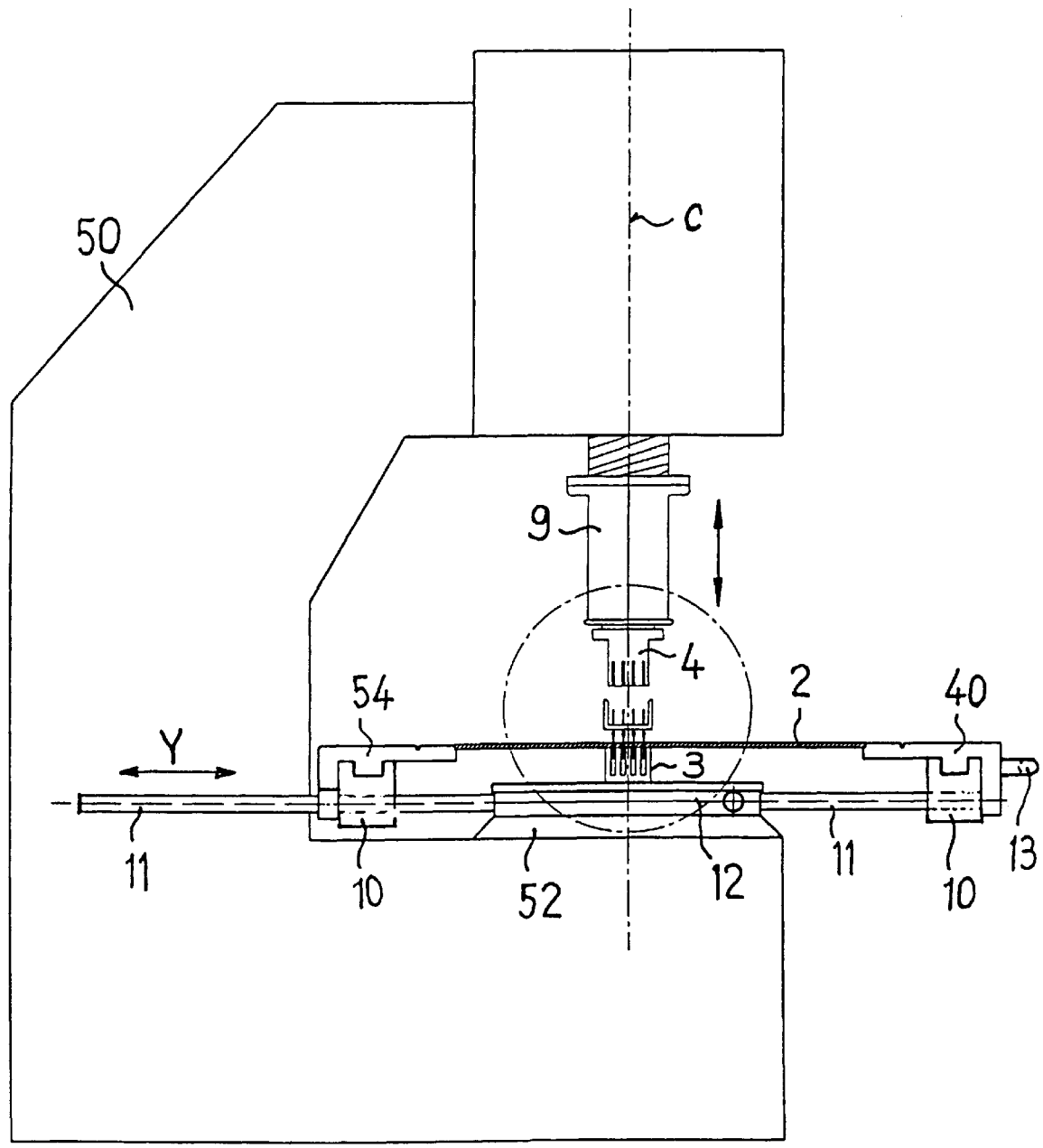
FIG. 1 shows a diagrammatic side view of a press which is provided with a device according to the invention.

As illustrated in FIG. 1, the press comprises a base structure or frame 50 which is provided with a ram 9 and a fixed table 52. Support bearings 12, in which guide shafts 11 are able to move in the direction of the Y-axis, are mounted on the fixed table 52.

Two adjacent guide shafts 11 are fixedly connected to two cross-bars 10 which extend in the direction of the X-axis. The front cross-bar 10 forms the fixed section of the X-carriage 40 and moves the latter with it in the Y-direction in the event of displacement of the guide shafts 11 through the support bearings 12.

The carriage 40 can move in the direction of the X-axis on the cross-bar 10, inter-alia, by means of the handles 13 which allow manual actuation.

A similar carriage 54 is arranged on the rear cross-bar 10, and the PCB 2 is attached between the rear carriage 54 and the front carriage 40, it being possible to move this PCB in the direction of the X-axis by means of the carriage 40 and in the direction of the Y-axis by means of the guide shafts 11.

Figure 2:
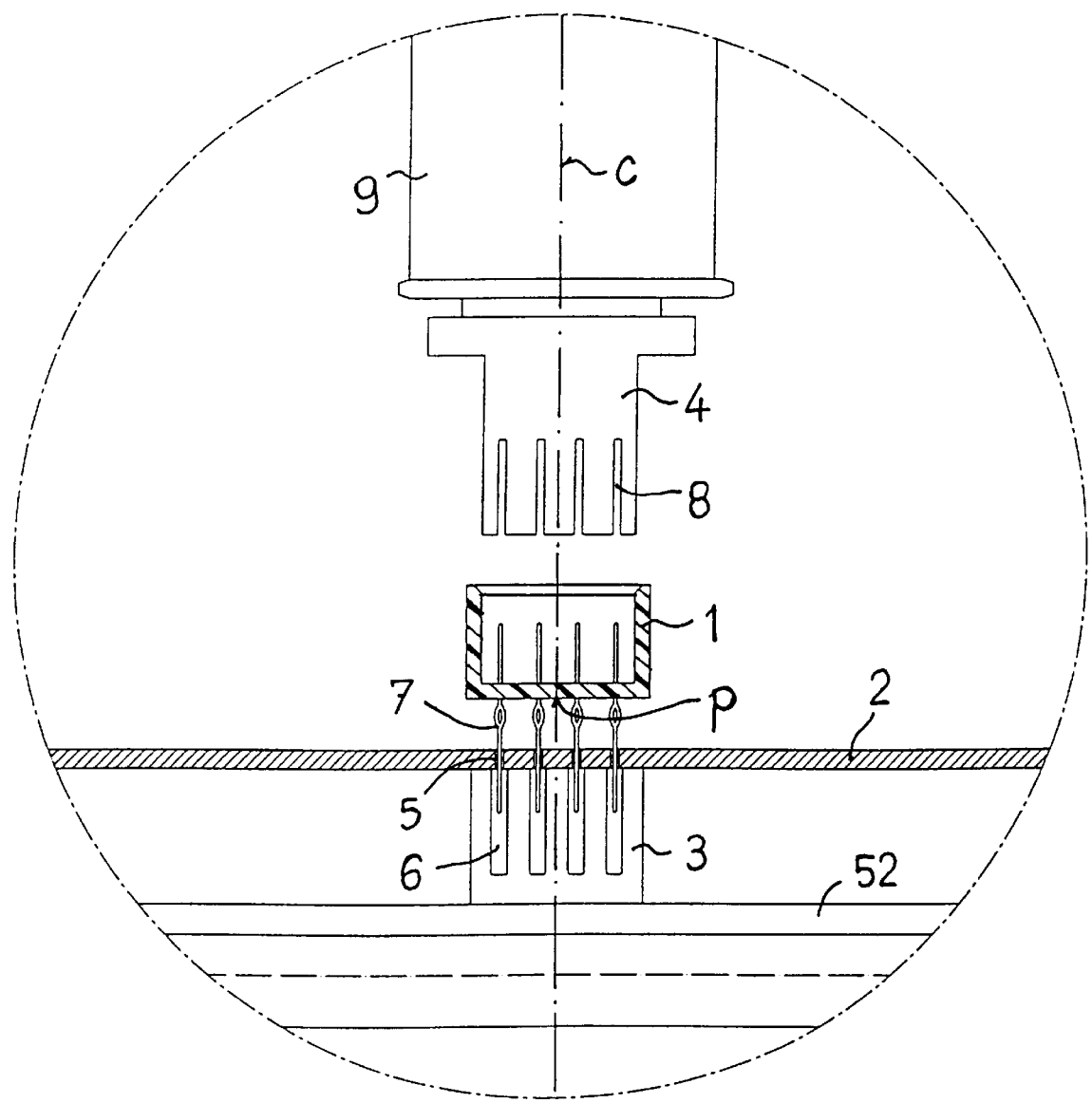
FIG. 2 shows a view of a detail of FIG. 1.

As shown more clearly in FIG. 2, the PCB 2 is, at various locations, provided with series of holes 5 which correspond to the selected insertion zone into which the attachment pins 7 (of the press-fit type) of an electrical component such as for example a connector 1 have to be inserted.

For this purpose, the ram 9 of the press is provided with an insertion die 4, and the fixed table 52 is provided with an anvil 3.

The central point of this insertion die 4 and of the anvil 3 both lie in the same vertical insertion centre line "c".

Since the contact pins 7 of the connector 1 project out of the bottom of the PCB 2 during insertion, the anvil 3 is provided at regular intervals with grooves 6, in order to create space for the projecting sections of the contact pins 7.

If the connector 1 also contains contact pins 7 which project on the top side, the insertion die 4 is likewise provided with grooves 8 at regular intervals.

Consequently, it is clear that the projecting sections of the contact pins 7, together with the connector housing 1, have to be accurately aligned, on the one hand with respect to the grooves 6 in the fixed anvil 3, and on the other hand with respect to the grooves 8 in the insertion die 4, and this alignment must be correct both in the direction of the X-axis and in the direction of the Y-axis.

Figure 3:
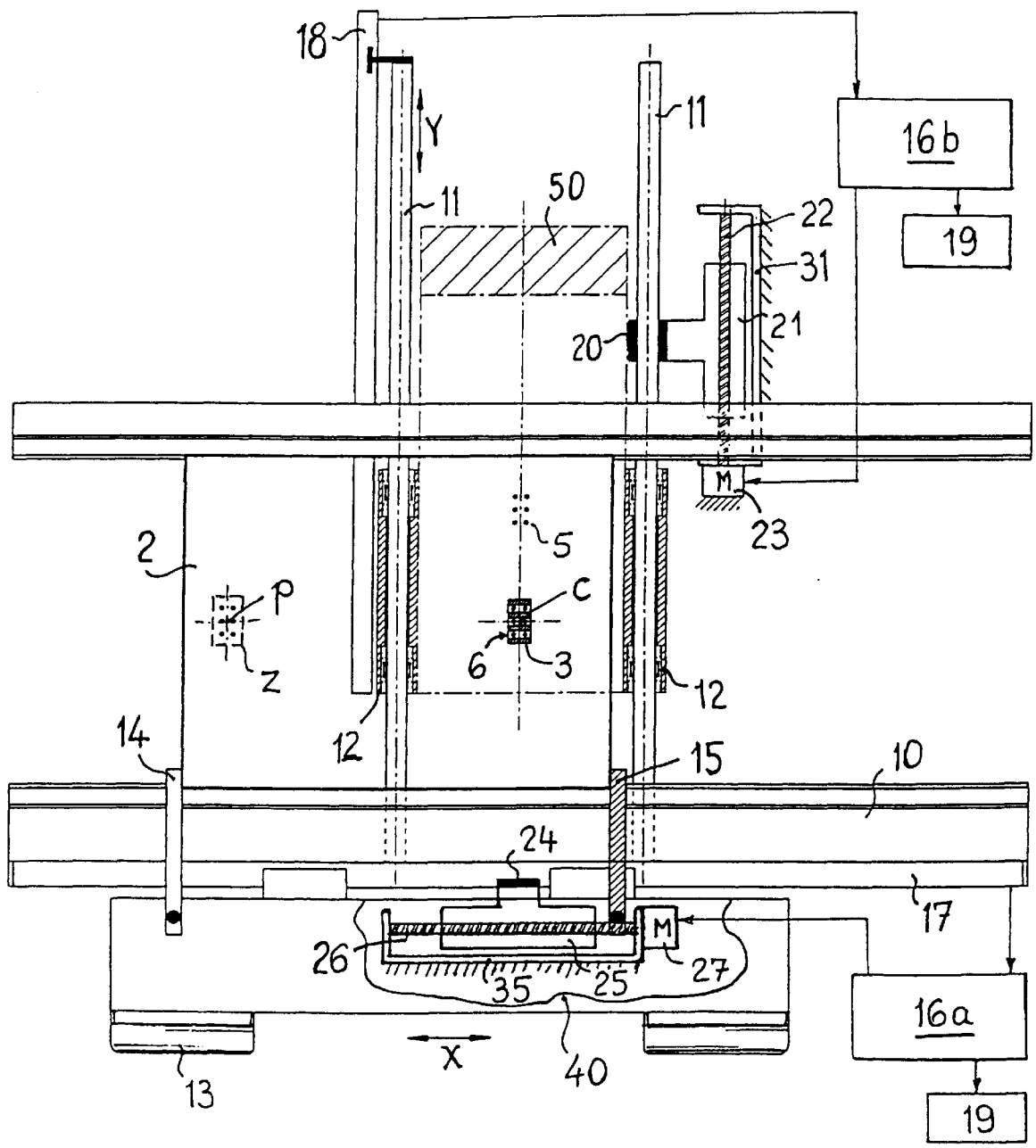
FIG. 3 shows a plan view of a device according to the invention.
Figure 4:
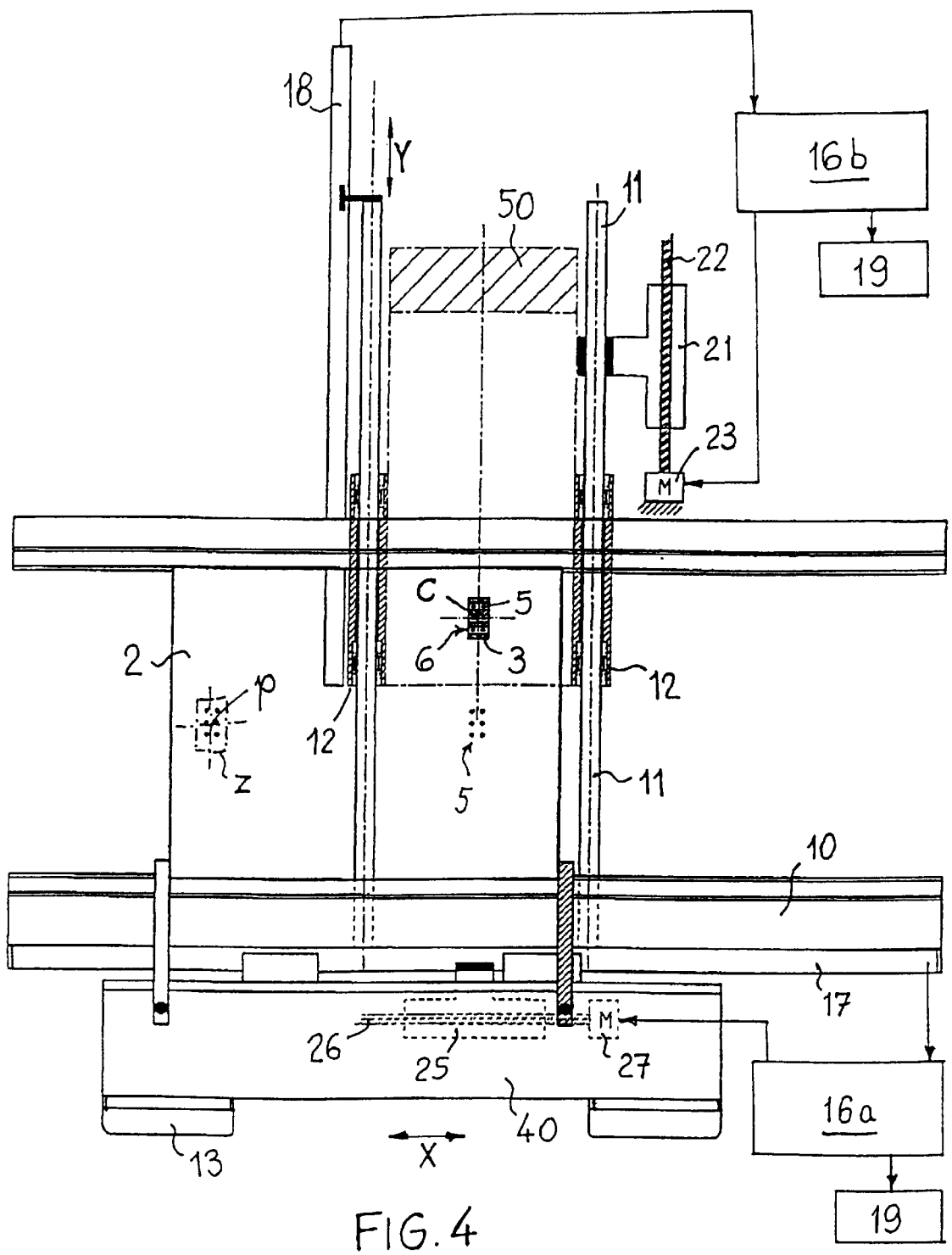
FIGS. 4 and 5 show similar views to that shown in FIG. 3, but with the PCB respectively displaced in the direction of the Y-axis and in the direction of the X-axis.
Figure 5:
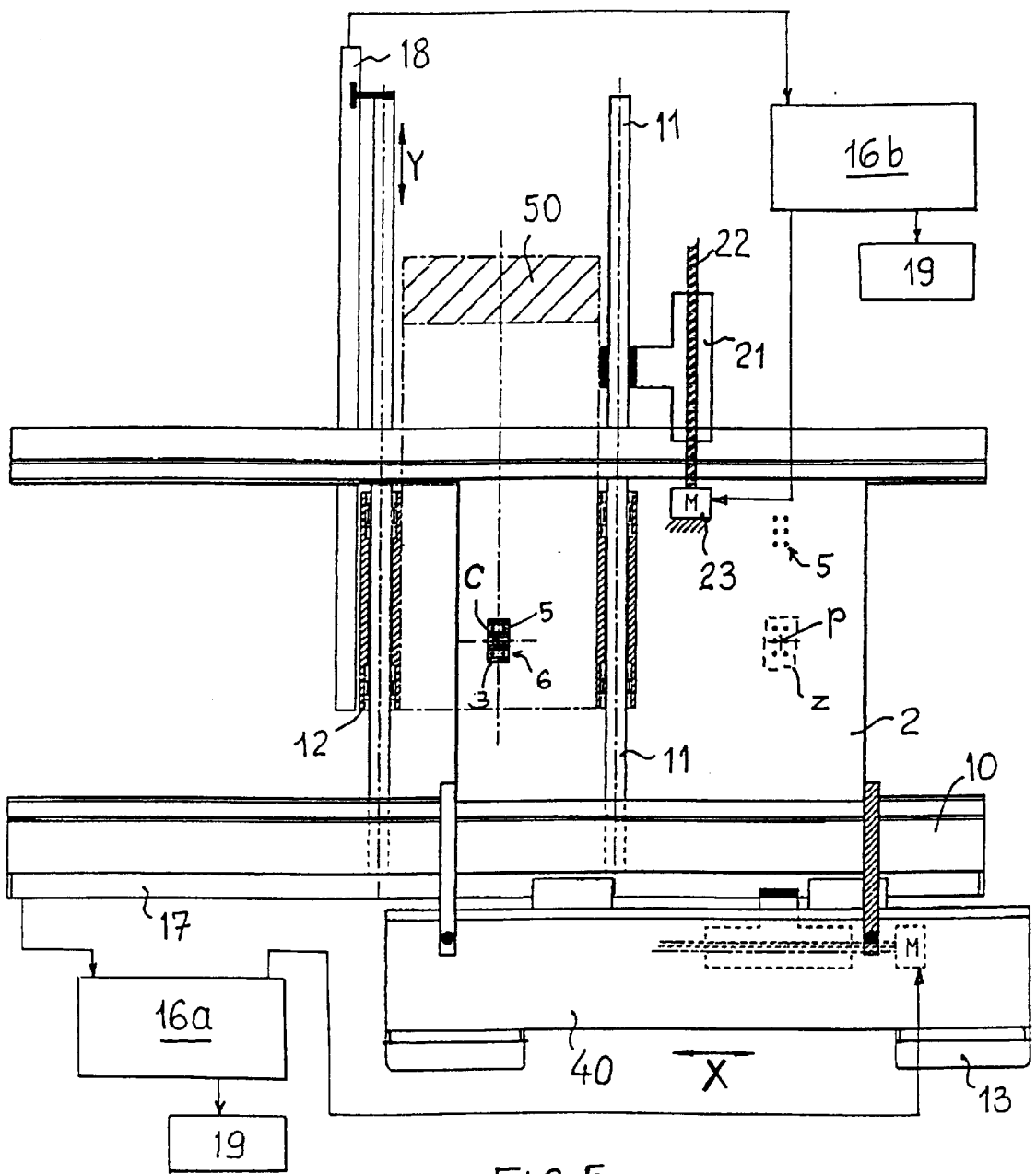

An exemplary embodiment of the invention is illustrated in FIG. 3.

As already described with reference to FIG. 1, the guide shafts 11 are supported and guided by the support bearings 12, which are fixedly connected to the frame 50 of the press.

On their front side, the guide shafts 11 are connected to a front cross-bar 10. A carriage 40 can be moved in the direction of the X-axis on this crossbar 10 by means of the handles 13.

The PCB 2 is supported and guided by means of the front cross-bar 10 and the rear cross-bar 54 and is positioned in the X-direction by means of a fixed (reference point) stop 14 and a moveable stop 15, which are attached to the carriage 40 and which clamp the PCB 2 in place.

The connector 1 may be pre-installed manually to the PCB 2 with the protruding contact pin section 7 into the holes 5 of the PCB 2 as shown in FIG. 2. The connector 1 may also be positioned manually onto the insertion die 4 before the connector 1 is installed on the PCB 2. The PCB 2, together with the connector 1 which is to be inserted, can consequently be moved in a horizontal plane, in the direction of the X-axis, from left to right by means of the carriage 40, and in the direction of the Y-axis by pulling forwards or pushing backwards the assembly comprising carriage 40, crossbars 10–54 and guide shafts 11 with respect to the fixed support bearings 12 of the frame 50.

One can imagine that such manual positioning of the PCB 2 with connector 1 with respect to the anvil 3 and the insertion die 4 is not a simple operation and cannot be carried out with sufficient accuracy.

In order to remedy this problem, the front crossbar 10 is provided with a linear encoder 17 in order to be able to detect the exact position of the PCB 2 and the insertion zone of the connector 1 in the direction of the X-axis.

An identical linear encoder 18 is arranged along one of the guide shafts 11, in order to be able to detect the exact position of the PCB 2 and the insertion zone of the connector 1 in the direction of the Y-axis.

The encoder 17 of the X-axis is electrically connected to the input of an X-control unit 16a, which sends a signal to a screen 19 in order to numerically display the position of the X-carriage 40.

The output of the X-control unit 16a is connected to a correction motor 27, which is connected to a guide base 35 and a threaded spindle 26, on which a correction carriage 25 can move in the direction of the X-axis. The motor 27 and the base 35 are fixed to the X-carriage 40.

The correction carriage 25 is provided with a brake system 24, which can be moved in the X-direction by the carriage. If the brake is activated, the X-carriage 40 is moved along by the guide base 35 of the correction carriage 25.

According to the invention, the brake system 24 is automatically activated from the moment at which the PCB 2 which is connected to the carriage 40 is displaced manually until the time at which the X-coordinate whose data have been stored in advance in the X-control unit 16a comes to lie within a limited distance from the centre line c of the insertion die 4 and the anvil 3.

To carry out a correction in the positioning in the direction of the Y-axis, the encoder 18 is electrically connected to the input of a Y-control unit 16b, which sends a signal to the screen 19 in order to display the position of the guide shafts 11 in the direction of the Y-axis, for example numerically.

The output of the Y-control unit 16b is connected to a correction motor 23, which is connected to a guide base 31 and a threaded spindle 22 on which a correction carriage 21 can move in the direction of the Y-axis. The correction motor 23 and the guide base 31 are fixed on the frame 50 of the press.

The correction carriage 21 is provided with a brake system 20, which can be moved in the Y-direction by the carriage. If the brake is activated, the guide shaft 11 is moved along by the correction carriage 21.

In this case, the brake system 20 is likewise activated from the moment at which the PCB 2 is moved manually to the time when the Y-coordinate whose data has been stored in advance in the Y-control unit comes to lie within a tracking zone, the area of which extends over a limited distance with respect to the centre line c of the insertion die 4 and the anvil 3 of the press.

To align an insertion zone of the connector 1 in the PCB 2 with respect to the centre line c of the anvil 3 and the insertion die 4, it is assumed that the operator has to define a reference position in the X-direction and in the Y-direction. All the coordinates of the insertion zones of the PCB 2 are defined in relation to this reference position.

By means of the encoder 17 on the X-axis, the X-control unit 16a can be adjusted or adapted to the actual position of the carriage 40 on the X-axis.

By means of the encoder 18 on the Y-axis, the Y-control unit 16b can be adjusted or adapted to the actual position of the guide shafts 11 and the carriage 40 on the Y-axis.

Since the PCB 2 is fixedly connected to the carriage 40, any position of the PCB 2 will be displayed on the screen 19 using the X and Y coordinates.

A programmable function can be used to set the control units 16a and 16b using a series of X-Y coordinates. According to any X-Y coordinate, the holes 5 in the insertion zones of the PCB 2 must correspond to the grooves 6 in the anvil 3, and consequently also to the grooves 8 in the insertion die 4, since anvil 3 and die 4 are fixedly connected to the frame 50 of the press and lie in the same vertical centre line c.

While the positioning program is running, the control units 16a and 16b, with the aid of the encoders 17 and 18, will establish the direction in which the carriage 40 will have to be moved.

This may, for example, be achieved by means of arrows which, on the screen 19, indicate the direction in which the carriage 40, together with the PCB 2 and the connector 1, has to be moved.

If the carriage 40 is moved in such a way that it comes to lie at a limited, predetermined distance close to the programmed Y-coordinate or centre line c, the Y-control unit 16b will activate the break system 20.

On the other hand, if the carriage 40 comes to lie at a defined distance close to the programmed X-coordinate or centre line C, the X-control unit 16a will activate the brake system 24.

At that moment, the carriage 40 is blocked in both directions, and the screen 19 shows that the press can be operated.

By means of the encoders 17 and 18, the control unit, comprising an X-control unit 16a and a Y-control unit 16b, can detect the actual position of the centre point p of the insertion zone z of the PCB 2 together with the connector 1.

If the actual position in the direction of the X-axis differs from the X-coordinate in the program, the X-control unit 16a will start the motor 27. This motor 27 will produce a rotational movement of the threaded spindle 26, with the result that the correction carriage 25 will be moved to the left or to the right.

Since the brake system 24 is fixedly connected to the correction carriage 25, and as the brake system 24 is clamped to the cross-bar 10 of the X-axis, the X-carriage 40 will move to the left or to the right through the rotation of the motor 27.

If the X-control unit 16a rotates the motor 27 in a direction which is such that the actual X-position coincides with the programmed X-coordinate of the centre line c, the holes 5 in the PCB 2 will coincide in the X-direction with the grooves 6 in the anvil 3.

If the actual position in the direction of the Y-axis differs from the programmed Y-coordinate, the Y-control unit 16b will start the motor 23. This motor 23 will rotate the threaded spindle 22, with the result that the correction carriage 21 will be moved forwards or backwards.

Since the brake system 20 is fixedly connected to the correction carriage 21, and as the brake system 20 is likewise clamped to the guide shaft 11 in the direction of the Y-axis, the X-carriage 40 will be moved forwards or backwards through the rotation of the motor 23.

The Y-control unit 16b will rotate the motor 23 in such a direction until the actual Y-position coincides with the programmed Y-coordinate of the centre line c, and then the holes 5 in the PCB 2 in the Y-direction will coincide with the grooves 6 in the anvil 3.

Before the press is actuated, the X-control unit 16a and the Y-control unit 16b, by means of the encoders 17 and 18, will check the actual position of the PCB 2.

By means of the device according to the invention, the PCB 2 can rapidly be moved from one insertion position to the other. As soon as the PCB 2 is approximately within the limited tracking zone of correction carriages 21 and 25, the brake systems 20 and 24 are activated.

The control units 16a, 16b and the motors 23, 27 then automatically assume responsibility for the further fine adjustment of the position of the PCB 2.

A fine adjustment in the direction of the X- and Y-axes is also necessary for accurate positioning of the insertion die 4 with respect to the connector housing 1, if the insertion die, which is generally of rectangular shape, has to penetrate into the connector housing, which is of corresponding design, as illustrated in FIG. 2.

Key to reference numerals
1: connector (body)
2: printed-circuit board
3: anvil
4: insertion die
5: hole in the printed-circuit board
6: groove in the anvil
7: contact pin (press-fit)
8: groove in the insertion die
9: ram
10: front cross-bar of X-carriage
11: guide shaft
12: support bearing
13: handle
14 fixed (reference point) stop
15: moveable stop
16a,b: X- and Y-control units, respectively
17: X-axis encoder
18: Y-axis encoder
19: screen
20: Y-axis brake system
21: Y-axis correction carriage
22: Y-axis threaded spindle
23: Y-axis correction motor
24: X-axis brake system
25: X-axis correction carriage
26: X-axis threaded spindle
27: X-axis correction motor
31: Y-axis guide base
35: X-axis guide base
40: Y-axis carriage
50: frame
52: fixed table
54: rear cross-bar of X-carriage

What is claimed is:

1. Method for aligning a printed circuit (PC) board in relation to an anvil and an insertion die of a press, prior to the insertion of at least one electronic component provided with press-fit contact pins into holes of a selected insertion zone of a PC-board, whereby the anvil and an insertion die are always aligned to each other along an insertion center line and whereby the PC-board is secured to a manually operated X-Y table, a center point of the selected insertion zone of the PC-board being positioned respectively according to a X-coordinate and a Y-coordinate with respect to the insertion center line, the table being movable in a first tracking area, the limits of which extending throughout a large distance with respect to the insertion center line and a second tracking area, the limits of which extending throughout a limited distance with respect to the insertion center line, characterized in that the X-Y table being manually moved along respective X- and Y axes within the first tracking area in order to move the center point of the selected insertion zone of the PC-board towards the insertion center line;

from the moment the center point of the selected insertion zone falls within the second tracking area, the manual movement along the respective X- and Y-axes are automatically blocked, a final tracking being taken over by corresponding X- and Y-adjustment mechanisms to achieve a last limited movement and a fine tuning of the alignment of the center point of the selected insertion zone of the PC-board with respect to the insertion center line of the press.

2. Method according to claim 1, characterized in that, prior to any manual movement of the X-Y table, at least one electronic component is pre-installed manually with its protruding contact pin sections into the holes of the selected insertion zone of the PC-board.

3. Method according to claim 1, characterized in that, prior to any manual movement of the X-Y table, at least one electronic component is pre-installed manually onto a insertion die.

4. A method in accordance with claim 1, wherein the final tracking comprises the steps of:

providing the X and Y carriages with respective correction carriages (21,25) operated by corresponding correction motors for moving each of the correction carriages relative to the X and Y carriages;

providing the X and Y carriages with encoders (17,18) for detecting a position of the X and Y carriages, the encoders being connected to control units operating the correction motors in response to a signal from the encoders;

detecting with the encoders the position of the X and Y carriages, the encoders sending a signal indicating the position to the control units; and moving the correction carriages with the correction motors in response to the control units receiving the signal from the encoders for automatically aligning the center point (p) of the selected insertion zone (z) in relation with the insertion center line (c) of the anvil (3) and an insertion die (4).

5. A method according to claim 4, characterized in that each of the correction carriages (21,25) is moved by means of a screwed spindle (22, 26) connected to the axle of the correction motor (23,27) in order to achieve relative movement between the correction carriages (21,25) and their corresponding X-Y carriages (40,11) when they are in a linked position.

6. A method according to claim 4, characterized in that the Y-carriage is provided with two guiding bars (11) which are connected to each other with crossbeams (10) whereby the guiding bars (11) are movable with respect to pilot bearings (12) rigidly connected to the frame of the press (50).

7. A method according to claim 4, characterized in that the X-carriage (40) is provided with handles (13) and in that the movement of said carriage along the X-axis is supported and guided by means of the crossbeams (10).

8. A method according to claim 4, characterized in that each correction carriage (21,25) is provided with a brake system (20,24) which is arranged to block the free manual movement of the respective X- and Y-carriage (40, 11) and to allow an automatic final adjustment by means of a relative movement between the correction carriages (21,25) and their corresponding linked X- and Y-carriages (40,11).

9. A method according to claim 4, characterized in that the anvil (3) is provided on its upper side with regularly spaced gaps such as grooves (6) whereby the distance between each groove (6) is corresponding to the standard spacing between the press-fit contact pins (7) from the electronic component (1).

10. A method according to claim 4, characterized in that an insertion die (4) is provided on its lower side with regularly spaced gaps such as grooves (8) whereby the distance between each groove (8) is corresponding with the standard spacing between the press-fit contact pins (7) from the electronic component (1).

11. A method according to claim 4, characterized in that the X-Y coordinates, of the real position of the PC-board, which are detected by the encoder means (17,18) and transmitted to the control units (16a,16b) are visualized by means of a display panel (19).

* * * * *